US011588188B2

(12) United States Patent
Ito et al.

(10) Patent No.: US 11,588,188 B2
(45) Date of Patent: Feb. 21, 2023

(54) BATTERY UNIT

(71) Applicant: Kubota Corporation, Osaka (JP)

(72) Inventors: Hirokazu Ito, Sakai (JP); Tomohiko Hisakuni, Sakai (JP)

(73) Assignee: Kubota Corporation, Osaka (JP)

( * ) Notice: Subject to any disclaimer, the term of this patent is extended or adjusted under 35 U.S.C. 154(b) by 182 days.

(21) Appl. No.: 17/095,723

(22) Filed: Nov. 11, 2020

(65) Prior Publication Data
US 2021/0359346 A1 Nov. 18, 2021

(30) Foreign Application Priority Data

May 12, 2020 (JP) .............................. JP2020-083602

(51) Int. Cl.
*H01M 10/44* (2006.01)
*H01M 10/42* (2006.01)
*G01R 31/327* (2006.01)
*H01M 10/48* (2006.01)

(52) U.S. Cl.
CPC ...... *H01M 10/425* (2013.01); *G01R 31/3278* (2013.01); *H01M 10/48* (2013.01); *H01M 2010/4271* (2013.01)

(58) Field of Classification Search
None
See application file for complete search history.

(56) References Cited

U.S. PATENT DOCUMENTS

| 5,642,030 A * | 6/1997 | Seelye .................. H02J 7/0031 |
| | | 320/101 |
| 7,368,829 B2 | 5/2008 | Tezuka |
| 10,295,584 B2 * | 5/2019 | Dulle .................... G01R 31/52 |
| 2006/0021098 A1 | 1/2006 | Tezuka |
| 2014/0372013 A1 * | 12/2014 | Shimizu ................. F02N 11/08 |
| | | 701/112 |
| 2020/0295586 A1 * | 9/2020 | Jeong .................... B60L 58/10 |

FOREIGN PATENT DOCUMENTS

| JP | 3535716 B2 | 3/2004 |
| JP | 4572168 B2 | 10/2010 |
| KR | 1020130032504 A | 4/2013 |
| WO | 2017148471 A1 | 9/2017 |

* cited by examiner

*Primary Examiner* — Raymond Alejandro
(74) *Attorney, Agent, or Firm* — The Webb Law Firm

(57) ABSTRACT

A battery unit includes a positive relay switch, a negative relay switch, a first resistor disposed in a third wiring portion extending between a positive external terminal and a negative external terminal, a second resistor serially connected to a portion on more negative side than the first resistor, a third resistor disposed in a second wiring portion and connected in parallel with the negative relay switch, a potential difference detection section capable of detecting a first potential difference which is a potential difference between the portion of the third wiring portion on more negative side than the first resistor and a negative terminal and a failure determination section for determining a failure of the positive relay switch and the negative relay switch respectively, based on the first potential difference.

5 Claims, 3 Drawing Sheets

Fig.2

| step | positive relay switch | negative relay switch | pre-charge circuit | potential difference at normal time | potential difference at abnormal time | state of abnormality |
|---|---|---|---|---|---|---|
| #01 | OFF | OFF | OFF | $V2 = 0$ | $V2 > 0$ | welding adhesion of positive relay switch |
| #02 | ON | OFF | OFF | $V2 = \frac{R2 + R3}{R1 + R2 + R3}V1$ | $V2 = \frac{R2}{R1 + R2}V1$ | welding adhesion of negative relay switch |
| #03 | OFF | OFF | OFF | $V2 = 0$ | $V2 > 0$ | welding adhesion of positive relay switch |
| #04 | OFF | ON | ON | converge gradually to: $V2 = \frac{R2}{R1 + R2}V1$ | $V2 = \frac{R2}{R1 + R2}V1$ (instantaneous) does not converge to: $V2 = \frac{R2}{R1 + R2}V1$ | welding adhesion of positive relay switch / contact failure/problem of negative relay switch |
| #05 | ON | ON | OFF | $V2 = \frac{R2}{R1 + R2}V1$ | $V2 \neq \frac{R2}{R1 + R2}V1$ | contact failure/problem of positive relay switch or abnormality of potential difference detection section |

Fig.3

| step | positive relay switch | negative relay switch | discharge circuit | potential difference at normal time | potential difference at abnormal time | state of abnormality |
|---|---|---|---|---|---|---|
| #11 | ON | ON | OFF | $V2 = \frac{R2}{R1+R2}V1$ | $V2 \neq \frac{R2}{R1+R2}V1$ | contact failure/problem of positive relay switch or abnormality of potential difference detection section |
| #12 | OFF | ON | ON | V2 drops gradually | $V2 = \frac{R2}{R1+R2}V1$ | welding adhesion of positive relay switch |
| #13 | OFF | OFF | OFF | $V2 = 0$ | $V2 > 0$ | welding adhesion of positive relay switch |
| #14 | ON | OFF | OFF | $V2 = \frac{R2+R3}{R1+R2+R3}V1$ | $V2 = \frac{R2}{R1+R2}V1$ | welding adhesion of negative relay switch |
| #15 | OFF | OFF | OFF | $V2 = 0$ | $V2 > 0$ | welding adhesion of positive relay switch |

BATTERY UNIT

CROSS-REFERENCE TO RELATED APPLICATION

This application claims priority to Japanese Patent Application No. 2020-083602 filed May 12, 2020, the disclosure of which is hereby incorporated by reference in its entirety.

BACKGROUND OF THE INVENTION

As disclosed in the publications of Japanese Patent No. 3536716 and Japanese Patent No. 4572168, the technique of detecting welding adhesion of a relay switch to a load subject is known conventionally. In the publications of Japanese Patent No. 3536716, a current value at time of discharging is determined and a welding adhesion state is determined if this current value exceeds a predetermined value. And, in the publications of Japanese Patent No. 4572168, the technique determines a voltage drop at the time of switching of relay switches ("main relays" in the document) on the positive side and the negative side respectively to their shutoff states, and a welding adhesion state is determined if there is found no such voltage drop.

In the case of the conventional techniques, the techniques generally detect welding adhesion of a relay switch in a battery unit, with the battery unit and the load subject being formed integral with each other; thus, the techniques do not allow detection of welding adhesion without connection to the load subject. Further, since the voltage of the battery unit may be vulnerable to influence from a circuit of the load subject at the time of determination of the voltage of the battery unit, it was necessary to compare values of a plurality of voltage sensors, in order to detect the welding adhesion of this relay switch. In view of the above-described state of the art, the object of the present invention is to provide a battery unit capable of detecting a welding adhesion of a relay switch incorporated therein with a simple arrangement.

SUMMARY OF THE INVENTION

A battery unit having a positive external terminal and a negative external terminal connectable to a load subject and configured to be attachable/detachable to/from the load subject, the battery unit comprising:
  a battery cell having a positive terminal and a negative terminal and capable of supplying electric power;
  a positive relay switch disposed in a first wiring portion extending between the positive terminal and the positive external terminal;
  a negative relay switch disposed in a second wiring portion extending between the negative terminal and the negative external terminal;
  a first resistor disposed in a third wiring portion extending between the positive external terminal and the negative external terminal;
  a second resistor serially connected to a portion of the third wiring portion which portion is on more negative side than the first resistor;
  a third resistor disposed in the second wiring portion and connected in parallel with the negative relay switch;
  a potential difference detection section connected to a portion of serial connection between the first resistor and the second resistor in the third wiring portion and connected to the negative terminal, the potential difference detection section being capable of detecting a first potential difference which is a potential difference between the portion of the third wiring portion on more negative side than the first resistor and the negative terminal; and
  a failure determination section for determining a failure of the positive relay switch and the negative relay switch respectively, based on the first potential difference.

With the present invention described above, inside the batter unit, there is incorporated a circuit for detecting the welding adhesion of the positive relay switch and the negative relay switch respectively, and this circuit includes the first resistor and the second resistor disposed on the third wiring portion, the third resistor disposed on the second wiring portion, the potential difference detection section and the failure determination section. Therefore, even when the battery is not connected to a load subject, detection of the welding adhesion is possible with this battery unit alone. Moreover, with the present invention, since detection of the welding adhesion is possible with the battery unit alone, the arrangement is free from influence from the circuit of the load subject, so that the accuracy of welding adhesion detection is improved. Consequently, there has been realized a battery unit capable of detecting a welding adhesion of a relay switch incorporated therein with a simple arrangement.

According to one preferred embodiment of the battery unit relating to the present invention:
  the potential difference detection section is configured to be capable of detecting a second potential difference which is a potential difference between the positive terminal and the negative terminal of the battery cell; and
  a wiring on the negative terminal side for the detection of the first potential difference is same as and common to a wiring on the negative terminal side for the detection of the second potential difference.

With the inventive arrangement described above, since a wiring for the detection of the first potential difference is same as and common to a wiring for the detection of the second potential difference, the circuit arrangement for potential difference detection can be simplified. Further, with this inventive arrangement, in comparison with an arrangement in which the wiring for the detection of the first potential difference and the wiring for the detection of the second potential difference are provided separately, variations or irregularities will hardly occur in the first potential difference and the second potential difference, so that the accuracy in potential difference detection can be improved.

According to one preferred embodiment of the battery unit relating to the present invention:
  the first resistor has a resistance value which is greater than the resistance value of the second resistor and greater also than the resistance value of the third resistor.

With the inventive arrangement described above, due to the large resistance value of the first resistor, the first potential difference to be detected by the potential difference detection section becomes smaller. Therefore, the voltage resistance of the potential difference detection section can be set small, thus being advantageous in the respect of power saving and cost reduction.

According to one preferred embodiment of the battery unit relating to the present invention:
  the potential difference detection section is incorporated within a part of a control unit capable of controlling switching of the positive relay switch and the negative relay switch respectively.

With the inventive arrangement described above, the control arrangement for the relay switches and the arrangement relating to welding adhesion detection of the relay switches are integrated to each other, whereby compactization and multiple functionalization of the control unit as a whole are made possible.

According to one preferred embodiment of the battery unit relating to the present invention:

the battery unit further comprises an informing section for informing the failure when the failure determination section has determined the failure.

With the inventive arrangement described above, a managing person or an operator of the battery unit can recognize welding adhesion states of the relay switches speedily.

BRIEF DESCRIPTION OF THE DRAWINGS

FIG. 2 is an explanatory view illustrating welding adhesion detections of contacts of a positive relay switch and a negative relay switch respectively, and FIG. 3 is an explanatory view illustrating welding adhesion detections of contacts of a positive relay switch and a negative relay switch respectively.

DETAILED DESCRIPTION OF THE PREFERRED EMBODIMENTS

[Circuit Arrangement of Battery Unit]

Figure 1:
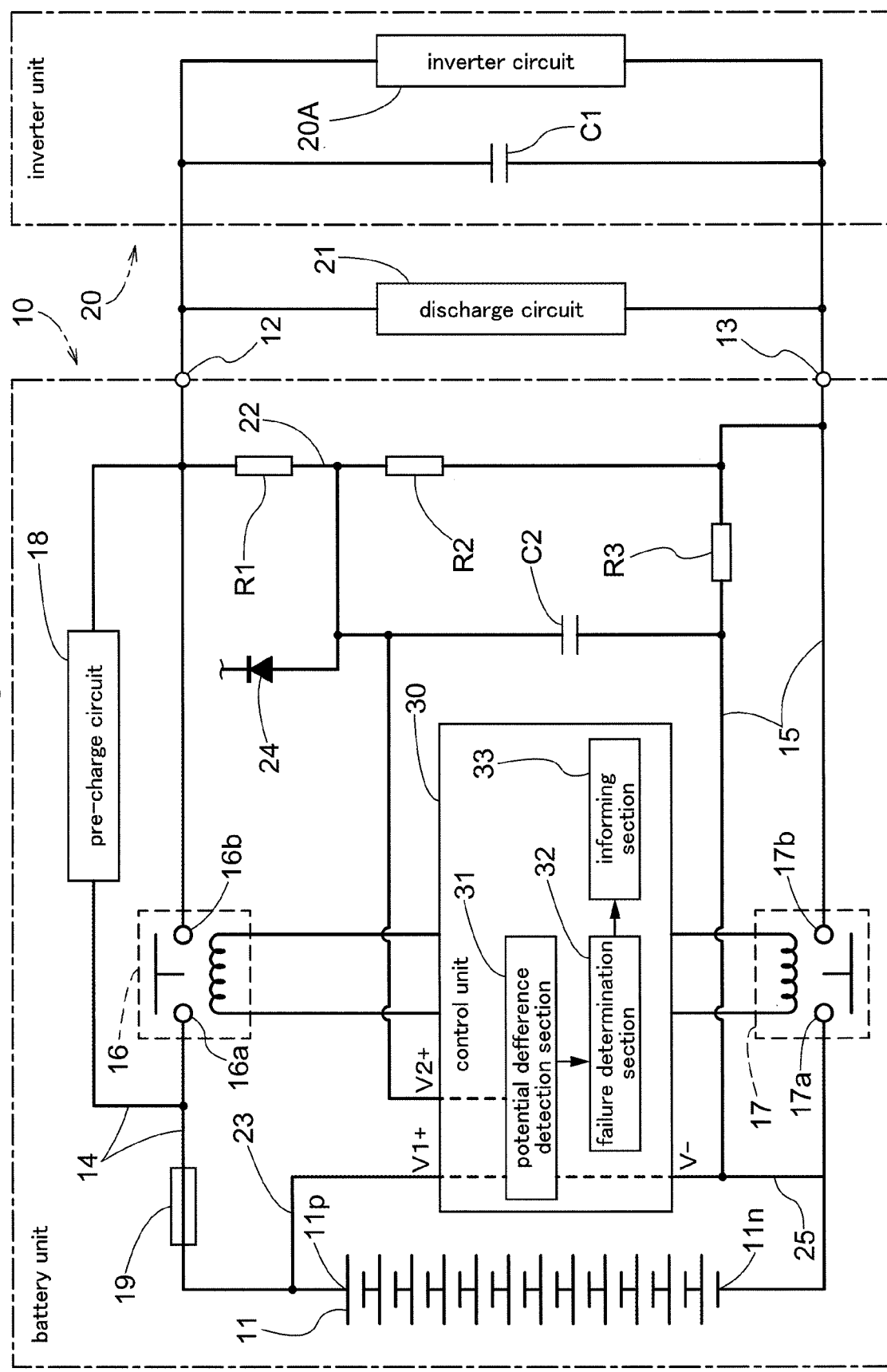
FIG. 1 is an electric circuit diagram showing a configuration of a battery unit.

FIG. 1 shows a battery unit 10 and an inverter unit 20 as a "load subject" to which the battery unit 10 is to be connected. The battery unit 10 includes a plurality of battery cells 11, a positive (positive pole) external terminal 12 and a negative (negative pole) external terminal 13. Namely, this battery unit 10 includes the positive external terminal 12 and the negative external terminal 13 which can be connected to the inverter unit 20. The battery unit 10 is configured to be attachable/detachable to/from the inverter unit 20. The inverter unit 20 is provided for controlling a motor or an actuator of an electrically powered mower for example.

Each one of the plurality of battery cells 11 includes a positive terminal and a negative terminal. As the positive terminal and the negative terminal respectively of the adjacent battery cells 11 are connected, the plurality of battery cells 11 are connected serially. From these plural battery cells 11, an electromotive power of about 50 volt is generated.

Between a positive terminal 11p at one end portion of the group (assembly) of the plurality of battery cells 11 serially connected and the positive external terminal 12, a positive (pole) side wiring portion 14 is provided; and the positive terminal 11p of the one end portion and the positive external terminal 12 are connected to each other via the positive side wiring portion 14. This positive side wiring portion 14 corresponds to what is defined as a "first wiring portion" in the present invention.

Further, between a negative terminal 11n at the other end portion of the group of the serially connected battery cells 11 and the negative external terminal 13, a negative (pole) side wiring portion 15 is provided; and the negative terminal 11n at the other end portion and the negative external terminal 13 are connected to each other via the negative side wiring portion 15. This negative side wiring portion 15 corresponds to what is defined as a "second wiring portion" in the present invention.

In this way, the battery cells 11 are not directly connected to the inverter unit 20 as the load subject, but connected to the inverter unit 20 via the positive external terminal 12 and the negative external terminal 13.

In midway of the positive side wiring portion 14, namely, between the positive terminal 11p and the positive external terminal 12, a positive (pole) relay switch 16 is provided. Namely, the positive relay switch 16 is disposed in the positive side wiring portion 14 extending between the positive terminal 11p and the positive external terminal 12. The positive relay switch 16 has its terminal 16a connected to the positive terminal 11p and has its terminal 16b connected to the positive external terminal 12.

In midway of the negative side wiring portion 15, namely, between the negative terminal 11n and the negative external terminal 13, a negative (pole) relay switch 17 is provided. Namely, the negative relay switch 17 is disposed in the negative side wiring portion 15 extending between the negative terminal 11n and the negative external terminal 13. The negative relay switch 17 has its terminal 17a connected to the negative terminal 11n and has its terminal 17b connected to the negative external terminal 13.

The positive relay switch 16 and the negative relay switch 17 respectively includes a contact which can be opened/closed by a magnet. When the contact of the positive relay switch 16 is closed, electric conduction is established between the terminal 16a and the terminal 16b of the positive relay switch 16. Whereas, when the contact of the positive relay switch 16 is opened, electric insulation is provided between terminal 16a and the terminal 16b of the positive relay switch 16. When the contact of the negative relay switch 17 is closed, electric conduction is established between the terminal 17a and the terminal 17b of the negative relay switch 17. Whereas, when the contact of the negative relay switch 17 is opened, electric insulation is provided between terminal 17a and the terminal 17b of the negative relay switch 17. Namely, in response to opening/closing of the contact of the positive relay switch 16 and the negative relay switch 17 respectively, the positive relay switch 16 and the negative relay switch 17 can be switched into an electrically conduction state and an electrically cutoff state respectively. When, the positive relay switch 16 and the negative relay switch 17 are rendered to the conducting respectively, the battery cells 11 can supply electric power to the inverter unit 20 as the load subject.

The battery unit 10 includes a control unit 30. This control unit 30 comprises an integrated circuit and a relay driver is incorporated in this control unit 30. With this relay driver, there is effected a control for switching over the positive relay switch 16 and the negative relay switch 17 to/between the conduction state and the shutoff, namely, ON/OFF control thereof.

A fuse 19 is disposed between the positive terminal 11p and the terminal 16a of the positive relay switch 16. When an overcurrent is generated in the positive side wiring portion 14, the fuse 19 protects the positive side wiring portion 14 therefrom.

The inverter unit 20 includes an inverter circuit 20A and a capacitor C1. For stabilizing the supply voltage to the inverter circuit 20A, the inverter circuit 20A and the capacitor C1 are parallel connected to each other. And, a discharge circuit 21 is provided in parallel connection with the inverter circuit 20A and the capacitor C1. In operation, when power supply to the inverter circuit 20A is to be stopped, the discharge circuit 21 will be switched to its energized state and an amount of charge stored in the capacitor C1 will be discharged by the discharge circuit 21.

At the time of starting of power supply from the battery unit 10 to the inverter unit 20, if a large inrush current is generated in accordance with the capacity of the capacitor C1, this may cause welding adhesion of the contacts respectively of the positive relay switch 16 and the negative relay switch 17. For this reason, a pre-charge circuit 18 is incorporated in the positive side wiring portion 14. And, this pre-charge circuit 18 is parallel connected to the positive relay switch 16. The pre-charge circuit 18 incorporates a switch which can be opened/closed, so that the pre-charge circuit 18 can be switched to an energized state and a shutoff state.

Prior to closing of the contact of the positive relay switch 16, if the pre-charge circuit 18 is switched to the energized state and the contact of the negative relay switch 17 is closed, electric conduction is established via the pre-charge circuit 18 between the battery cell 11 and the inverter unit 20. Since the pre-charge circuit 18 has a resistance value which is greater than the resistance value of the positive relay switch 16, an electric current generated in this case is a current which is smaller than that generated at the time of closing of the positive relay switch 16, and the capacitor C1 will be charged progressively. And, even if the positive relay switch 16 is closed under the state of charge being stored in the capacitor C1, no inrush current will be generated thanks to the capacitor C1. In this way, the risk of welding adhesion of the respective contacts of the positive relay switch 16 and the negative relay switch 17 is reduced significantly.

[Welding Adhesion Detection of Relay Switches]

The battery unit 10 is configured to be capable of detecting welding adhesion of the respective contacts of the positive relay switch 16 and the negative relay switch 17. There is provided a detection wiring portion 22 between the positive external terminal 12 and the negative external terminal 13 inside the battery unit 10. This detection wiring portion 22 incorporates resistors R1, R2 and each one of these resistors R1, R2 is serially connected. More particularly, the resistor R2 is serially connected to a portion of a more negative side of the detection wiring portion 22 than the resistor R1. The detection wiring portion 22 corresponds to what is defined as a "third wiring portion" in the present invention. The resistor R1 corresponds to what is defined as a "first resistor" and the resistor R2 corresponds to what is defined as a "second resistor" in the present invention, respectively.

The resistor R1 has a resistance value of 270 k$\Omega$, for instance. The resistor R2 has a resistance value of 10 k$\Omega$, for instance. As each one of the resistors R1, R2 has a resistance value which is greater than the resistance value of the inverter unit 20 and a small current will flow in the detection wiring portion 22.

Further, the negative side wiring portion 15 incorporates a resistor R3 and this resistor R3 is parallel connected to the negative relay switch 17. The resistor R2 is what is defined as a "third resistor" in the present invention. The resistor R3 has a resistance value of from 6 k$\Omega$ to 7$\Omega$, for instance. The resistor R1 has the resistance value which is greater than the resistance value of the resistor R2 and greater also than the resistance value of the resistor R3. Thus, in comparison with an arrangement of the resistance value of the resistor R1 being smaller than the resistance value of the resistor R2 or of the resistor R3, the voltage resistance of a potential difference detection section 31 can be set small, and power saving and cost reduction of the potential difference detection section 31 are made possible. When the contact of the negative relay switch 17 is closed, little current will flow in the resistor R3.

The detection wiring portion 22 is disposed between the positive external terminal 12 and the negative external terminal 13, and the negative relay switch 17 and the resistor R3 are parallel connected to the negative side wiring portion 15. This arrangement forms a closed circuit in the battery unit 10. With this, even in the event of absence of any object or subject to which the positive external terminal 12 and the negative external terminal 13 are connected, with the battery unit 10 alone, it is possible to detect welding adhesion of the respective contacts of the positive relay switch 16 and the negative relay switch 17.

The control unit 30 incorporates the potential difference detection section 31. In other words, the potential difference detection section 31 is incorporated as a part of the control unit 30 which is capable of controlling ON/OFF of the positive relay switch 16 and the negative relay switch 17, respectively.

From the serial connection between the resistor R1 and the resistor R2, a wiring portion branches to the positive pole side of the potential difference detection section 31, and on the positive pole side of the potential difference detection section 31, a voltage denoted with a sign "V2+" in FIG. 1 is applied. Further, to the positive pole side of the potential difference detection section 31, there is also connected a voltage clipping diode 24 (anode) for the potential difference detection section 31. Also, a capacitor C2 is provided in parallel connection with the control unit 30. This capacitor C2 is provided for coping with noise problem with the potential difference detection section 31. A common wiring portion 25 on the negative pole side of the potential difference detection section 31 is connected to the negative terminal 11$n$.

A wring portion 23 is connected to/between the positive terminal 11$p$ and the positive pole side of the potential difference detection section 31. The potential difference detection section 31 can detect a potential difference V1 (potential difference between "V1+" and "V−" in FIG. 1) between the positive terminal 11$p$ and the negative terminal 11$n$ of the battery cell 11. Namely, the potential difference detection section 31 is configured to be capable of detecting the potential difference V1 between the positive terminal 11$p$ and the negative terminal 11$n$ at the other end portion.

Further, the potential difference detection section 31 can detect also a potential difference V2 between the portion of serial connection between the resistor R1 and the resistor R2 of the detection wiring portion 22 (the portion on more negative pole side than the resistor R1) and the negative terminal 11$n$ (V2 being the potential difference between "V2+" and "V−" in FIG. 1). The potential difference V2 corresponds to what is defined as a "first potential difference" in the present invention. Further, the potential difference V1 detected by the potential difference detection section 31 corresponds to what is defined as a "second potential difference" in the present invention.

The common wiring portion 25 on the negative pole side of the potential difference detection section 31 is used for the detection of the potential difference V2 and used also for the detection of the potential difference V1. Namely, the wiring on the negative terminal 11$n$ side for the detection of the potential difference V2 and the wiring on the negative terminal 11$n$ side for the detection of the potential difference V1 are the same common wiring portion 25. In comparison with an arrangement in which the wiring on the negative terminal 11$n$ side for the detection of the potential difference V2 and the wiring on the negative terminal 11$n$ side for the detection of the potential difference V1 are provided separately, variations or irregularities will occur less likely in the potential difference V1 and the potential difference V2, respectively, so the detection accuracy of the potential difference V1 and the potential difference V2 is improved.

The control unit 30 incorporates a failure determination section 32. This failure determination section 32 determines a failure of the positive relay switch 16 and the negative relay switch 17 respectively, based on the potential difference V2 detected by the potential difference detection section 31.

The control unit 30 further incorporates an informing section 33. This informing section 33 is constituted of e.g. a display device or a liquid crystal display having 7 (seven) segments and is configured to be capable of displaying various states of the battery unit 10. The informing section 33 is configured to be capable of displaying various failures or troubles in the positive relay switch 16 and the negative relay switch 17 respectively determined by the failure determination section 32. Alternatively, the informing section 33 may be constituted of a buzzer or any other audio guide device.

With reference to FIG. 2 and FIG. 3, an explanation will be made on informing of welding adhesion of the respective contacts of the positive relay switch 16 and the negative relay switch 17. FIG. 2 shows step #01 to step #05 and FIG. 3 shows step #11 to step #15. The conduction states and the cutoff states of the positive relay switch 16 and the negative relay switch 17 at the respective steps are shown. A state in which the control unit 30 effects control for opening the respective contacts of the positive relay switch 16 and the negative relay switch 17 is shown as "OFF" in FIGS. 2 and 3. Further, a state in which the control unit 30 effects control of closing the respective contacts of the positive relay switch 16 and the negative relay switch 17 is shown as "ON" in FIGS. 2 and 3. In FIG. 2, the energized state of the pre-charge circuit 18 is shown as "ON" and the cutoff state of the pre-charge circuit 18 is shown as "OFF". In FIG. 3, the energized state of the discharge circuit 21 is shown as "ON" and the cutoff state of the discharge circuit 21 is shown as "OFF".

The welding adhesion detection illustrated in FIG. 2 is implemented at the time of startup of the inverter unit 20. Incidentally, this welding adhesion detection may alternatively be implemented at the time of startup of the battery unit 10 or the welding adhesion detection illustrated in FIG. 2 may be implemented even at the time of startup of a welding adhesion check mode with the battery unit 10 alone. Incidentally, the welding adhesion detection illustrated in FIG. 2 may be implemented under a condition of nothing being connected to the positive external terminal 12 and the negative external terminal 13 or under a condition of a load subject such as the inverter unit 20 being connected to the positive external terminal 12 and the negative external terminal 13. The welding adhesion informing illustrated in FIG. 3 is effected at the time of stopping of the battery unit 10. Incidentally, the welding adhesion detection illustrated in FIG. 3 is implemented under a condition of a load subject such as the inverter unit 20 being connected to the positive external terminal 12 and the negative external terminal 13.

Next, the steps of welding adhesion detection illustrated in FIG. 2 will be explained. At step #01, the control unit 30 effects control to render the positive relay switch 16 and the negative relay switch 17 to the cutoff states respectively. In this, the pre-charge circuit 18 parallel connected to the positive relay switch 16 will be cutoff. Under this state, if the potential difference V2 detected by the potential difference detection section 31 is greater than zero (0) value, the failure determination section 32 will determine this as welding adhesion of the positive relay switch 16.

At step #02, the control unit 30 effects control to render the positive relay switch 16 alone to the conduction state. In this state, electric conduction is established among the positive side wiring portion 14, the detection wiring portion 22, the resistor R3 side wiring portion of the negative side wiring portion 15. In this state, it becomes possible for the potential difference detection section 31 to detect the potential difference V2 of the resistor R2 and the resistor R3 serially connected to each other. If the resistance value of the resistor R1 is "R1", the resistance value of the resistor R2 is "R2", the resistance value of the resistor R3 is "R3" and the potential difference V2 of the resistor R2 and the resistor R3 is "V2a"; then, V2a can be expressed by the following mathematical formula.

$$V2a = V1 \times (R2+R3)/(R1+R2+R3)$$

In case the negative relay switch 17 has welded, almost no current will flow in the resistor R3 and current will flow in the negative relay switch 17. Therefore, in this state, the potential difference V2 of the resistor R2 alone will be detected by the potential difference detection section 31. If the potential difference V2 at this time is "V2b", then, V2b can be expressed by the following mathematical formula.

$$V2b = V1 \times R2/(R1+R2).$$

As V2a is clearly greater than V2b, the potential difference detection section 31 can clearly distinguish between V2a and V2b. If the potential difference detection section 31 detects V2b as the potential difference V2 at step #02, the failure determination section 32 determines this as the welding adhesion state of the negative relay switch 17.

At step #03, the control unit 30 controls to switch the positive relay switch 16 to the cutoff state. At step #04, the control unit 30 controls to switch the negative relay switch 17 and the pre-charge circuit 18 to the conduction state and the energized state, respectively. In response to the switching of the negative relay switch 17 to the conduction state, almost no current will flow in the resistor R3. Namely, current will flow in the pre-charge circuit 18 in the positive side wiring portion 14, the resistors R1, R2 in the detection wiring portion 22 and the negative relay switch 17 in the negative side wiring portion 15. Since the pre-charge circuit 18 is constituted of the serial connection of e.g. the resistors having large resistance values and the capacitor, the potential difference V2 detected by the potential difference detection section 31 will become V2b gradually. Namely, when the control unit 30 controls to switch the negative relay switch 17 and the pre-charge circuit 18 to the conduction state and the energized state, the potential difference V2 will be converged to V2b gradually.

When the control unit 30 effects the control of switching the negative relay switch 17 and the pre-charge circuit 18 to the conduction state and the energized state, if the potential difference V2 becomes V2b immediately, this means that the positive relay switch 16 has been welded. Namely, if the potential difference V2 converges to V2b immediately at step #04, the failure determination section 32 will determine this as the welding adhesion state of the positive relay switch 16. Further, in case the potential difference does not converge to V2b, the failure determination section 32 will determine this as contact failure or problem in the negative relay switch 17. Here, the contact failure or problem in the negative relay switch 17 means that the negative relay switch 17 is not rendered into the conduction state or the negative relay switch 17 is not be rendered into sufficiently conduction state.

At step #04, if the failure determination section 32 determines normal state, then, at step #05, the control unit 30 controls to switch over the positive relay switch 16 to the conduction state, whereby both the positive relay switch 16 and the negative relay switch 17 will be switched to the conduction state. In this state, the potential difference V2 detected by the potential difference detection section 31 becomes V2b. Whereas, in case the potential difference V2 fails to become V2b, this will be determined by the failure determination section 32 as either a contact failure or problem of the positive relay switch 16 or a failure of the potential difference detection section 31. If no failure is determined by the failure determination section at steps #01 through #05, then, this means that the positive relay switch 16 and the negative relay switch 17 are under the normal states, respectively.

Next, the steps of welding adhesion detection illustrated in FIG. 3 will be explained. Incidentally, in the welding adhesion detection illustrated in FIG. 3, no power is supplied to the pre-charge circuit 18. At step #11, like the case of step #05 shown in FIG. 2, both the positive relay switch 16 and the negative relay switch 17 are under the conduction state and in this state, the potential difference V2 detected by the potential difference detection section 31 becomes V2b. If the potential difference V2 fails to become V2b, this is determined by the failure determination section 32 as contact failure/problem of the positive relay switch 16 or a failure of the potential difference detection section 31.

At step #12, the control unit 30 controls to switch the positive relay switch 16 to the cutoff state and to switch the discharge circuit 21 to the energized state. With this, in response to switching of the contact of the positive relay switch 16 to the cutoff state, an amount of charge stored in the capacitor C1 is discharged via the discharge circuit 21 and the potential difference V2 detected by the potential difference detection section 31 drops to zero value. If the positive relay switch 16 is not welded, the potential difference V2 will asymptoticly approach the zero value. If the potential difference V2 does not drop, but converges to V2b, this is determined as welding adhesion of the positive relay switch 16 by the failure determination section 32.

Upon completion (or substantial completion) of discharging of the capacitor C1, at step #13, the control unit 30 switches the contact of the negative relay switch 17 from the conduction state to the shutoff state and switches also the discharge circuit 21 to the shutoff state. With this the respective contacts of the positive relay switch 16 and the negative relay switch 17 will be rendered to the cutoff states. Under this condition, if the potential difference V2 detected by the potential difference detection section 31 has a value greater than zero, then, this is determined by the failure determination section 32 as welding adhesion of the positive relay switch 16.

At step #14, the control unit 30 switches only the contact of the positive relay switch 16 to the conduction state. If the negative relay switch 17 is not welded, the potential difference V2 becomes V2a. If the potential difference V2 becomes V2b, this is determined by the failure determination section 32 as welding adhesion of the negative relay switch 17.

At step #15, the control unit 30 switches the contact of the positive relay switch 16 from the conduction state to the shutoff state, so that the respective contacts of the positive relay switch 16 and the negative relay switch 17 are rendered into the shutoff states. Under this condition, if the potential difference V2 detected by the potential difference detection section 31 has a value greater than zero, this is determined as welding adhesion of the positive relay switch 16 by the failure determination section 32.

Other Embodiments

The present invention is not limited to the arrangements disclosed in the foregoing embodiment. Next, typical other embodiments of the present invention will be listed.

(1) In the foregoing embodiment, the inverter unit 20 is provided for controlling a motor or an actuator of an electrically powered mower for instance. However, this embodiment is not limiting. For example, the inverter unit 20 may be provided in an electrically powered forklift, an electrically powered tool or an electrically powered multiple-purpose vehicle. Moreover, the load subject is not limited to the inverter unit 20. For instance, the load subject maybe a servo amplifier.

(2) The battery cell 11 shown in the foregoing embodiment may be a lithium ion battery for instance, or may be a lithium ion polymer battery cell or a nickel metal hydride battery. Further, the battery cell 11 may be an all solid state battery. Moreover, in the foregoing, a plurality of battery cells 11 are connected in series. Instead, the battery cell 11 may be a single component or a plurality of battery cells 11 may be connected in parallel with each other.

(3) In the foregoing embodiment, the common wiring portion 25 on the negative pole side of the potential difference detection section 31 is used for detection of the potential difference V2 as well as detection of the potential difference V1. However, this embodiment is not limiting. As the negative pole side wiring of the potential difference detection section 31, a wiring for detection of the potential difference V2 and a wiring for detection of the potential difference V1 may be provided separately.

(4) In the foregoing embodiment, the resistor R1 has a resistance value which is greater than both the resistance value of the resistor R2 and the resistance value of the resistor R3. However, this embodiment is not limiting. For instance, the resistor R1, the resistor R2 and the resistor R3 may respectively have a same resistance value.

(5) In the foregoing embodiment, the potential difference detection section 31 is incorporated as a part of the control unit 30. However, this embodiment is not limiting. For instance, the potential difference detection section 31 may be constituted as e.g. a control circuit board separate from the control unit 30.

(6) In the foregoing embodiment, the pre-charge circuit 18 is incorporated within the battery unit 10. Alternatively, the pre-charge circuit 18 may be provided outside the battery unit 10 and connected as such to the battery unit 10.

The present invention is applicable to a battery unit having a positive external terminal and a negative external terminal which can be connected to a load subject. Incidentally, the arrangements disclosed in the foregoing embodiment (including the other embodiments) can be used in any desired combinations with the embodiments disclosed in the other embodiments as long as no contradiction results from such combining. Further, the embodiments disclosed in this specification are only illustrative and embodiments of the present invention are not limited thereto, but various modifications can be made therein appropriately within a scope not deviating from the essence of the present invention.

The invention claimed is:

1. A battery unit having a positive external terminal and a negative external terminal connectable to a load subject and configured to be attachable/detachable to/from the load subject, the battery unit comprising:

a battery cell having a positive terminal and a negative terminal and capable of supplying electric power;

a positive relay switch disposed in a first wiring portion extending between the positive terminal and the positive external terminal;

a negative relay switch disposed in a second wiring portion extending between the negative terminal and the negative external terminal;

a first resistor disposed in a third wiring portion extending between the positive external terminal and the negative external terminal;

a second resistor serially connected to a portion of the third wiring portion which portion is on more negative side than the first resistor;

a third resistor disposed in the second wiring portion and connected in parallel with the negative relay switch;

a potential difference detection section connected to a portion of serial connection between the first resistor and the second resistor in the third wiring portion and connected to the negative terminal, the potential difference detection section being capable of detecting a first potential difference which is a potential difference between the portion of the third wiring portion on more negative side than the first resistor and the negative terminal; and a failure determination section for determining a failure of the positive relay switch and the negative relay switch respectively, based on the first potential difference.

2. The battery unit of claim 1, wherein:

the potential difference detection section is configured to be capable of detecting a second potential difference which is a potential difference between the positive terminal and the negative terminal of the battery cell; and a wiring on the negative terminal side for the detection of the first potential difference is same as and common to a wiring on the negative terminal side for the detection of the second potential difference.

3. The battery unit of claim 1, wherein the first resistor has a resistance value which is greater than the resistance value of the second resistor and greater also than the resistance value of the third resistor.

4. The battery unit of claim 1, wherein the potential difference detection section is incorporated within a part of a control unit capable of controlling switching of the positive relay switch and the negative relay switch respectively.

5. The battery unit of claim 1, further comprising an informing section for informing the failure when the failure determination section has determined the failure.

\* \* \* \* \*